(12) United States Patent
Zhu et al.

(10) Patent No.: US 9,070,870 B2
(45) Date of Patent: Jun. 30, 2015

(54) METHOD OF FABRICATING A MAGNETIC TUNNEL JUNCTION (MTJ) DEVICE WITH REDUCED SWITCHING CURRENT

(71) Applicant: QUALCOMM Incorporated, San Diego, CA (US)

(72) Inventors: Xiaochun Zhu, San Diego, CA (US); Xia Li, San Diego, CA (US); Wei-Chuan Chen, Hsinchu (TW); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/219,026

(22) Filed: Mar. 19, 2014

(65) Prior Publication Data

US 2014/0206104 A1 Jul. 24, 2014

Related U.S. Application Data

(62) Division of application No. 13/358,694, filed on Jan. 26, 2012, now Pat. No. 8,704,320.

(60) Provisional application No. 61/533,413, filed on Sep. 12, 2011.

(51) Int. Cl.
*H01L 21/00* (2006.01)
*H01L 43/12* (2006.01)
(Continued)

(52) U.S. Cl.
CPC ............. *H01L 43/12* (2013.01); *G11C 11/16* (2013.01); *H01L 43/08* (2013.01); *H01L 43/10* (2013.01);
(Continued)

(58) Field of Classification Search
CPC ............. H01L 27/11502; H01L 27/11507; H01L 21/31691
USPC ............. 438/3; 257/296, 421, 423, E29.323
See application file for complete search history.

(56) References Cited

U.S. PATENT DOCUMENTS 7,593,196 B2 9/2009 Gill
2005/0106810 A1 5/2005 Pakala et al.
(Continued)

FOREIGN PATENT DOCUMENTS

EP 2333826 A1 6/2011
JP 2006261592 A 9/2006
(Continued)

OTHER PUBLICATIONS

International Search Report and Written Opinion—PCT/US2012/054915—ISA/EPO —Jan. 23, 2013.
(Continued)

*Primary Examiner* — Phuc Dang
(74) *Attorney, Agent, or Firm* — Sam Talpalatsky; Nicholas J. Pauley; Paul Holdaway

(57) ABSTRACT

Partial perpendicular magnetic anisotropy (PPMA) type magnetic random access memory cells are constructed using processes and structural configurations that induce a directed static strain/stress on an MTJ to increase the perpendicular magnetic anisotropy. Consequently, reduced switching current of the MTJ results. The directed static strain/stress on the MTJ is induced in a controlled direction and/or with a controlled magnitude during fabrication. The MTJ is permanently subject to a predetermined directed stress and permanently includes the directed static strain/strain that provides reduced switching current.

20 Claims, 15 Drawing Sheets

(51) Int. Cl.
    *G11C 11/16*     (2006.01)
    *H01L 43/08*     (2006.01)
    *H01L 43/10*     (2006.01)
    *H01L 27/22*     (2006.01)
    *H01L 41/12*     (2006.01)
    *H01F 10/32*     (2006.01)
    *H01F 41/32*     (2006.01)

(52) U.S. Cl.
    CPC .............. *H01L 27/222* (2013.01); *H01L 41/12* (2013.01); *H01F 10/3254* (2013.01); *H01F 10/3286* (2013.01); *H01F 41/325* (2013.01)

(56) References Cited

U.S. PATENT DOCUMENTS

| | | |
|---|---|---|
| 2006/0215442 A1 | 9/2006 | Wunderlich et al. |
| 2006/0220084 A1 | 10/2006 | Umehara et al. |
| 2006/0234445 A1* | 10/2006 | Yang ............................ 438/257 |
| 2008/0164502 A1 | 7/2008 | Fukumoto et al. |
| 2009/0080240 A1 | 3/2009 | Drewes |
| 2009/0206425 A1 | 8/2009 | Tsujiuchi |
| 2009/0209050 A1* | 8/2009 | Wang et al. ........................ 438/3 |
| 2010/0032738 A1 | 2/2010 | Zhu |
| 2010/0084724 A1 | 4/2010 | Dimitrov et al. |
| 2010/0097846 A1 | 4/2010 | Sugiura et al. |
| 2010/0117169 A1 | 5/2010 | Anderson et al. |
| 2010/0193890 A1 | 8/2010 | Suzuki et al. |
| 2010/0244163 A1 | 9/2010 | Daibou et al. |
| 2011/0012215 A1 | 1/2011 | Nguyen et al. |
| 2011/0267874 A1 | 11/2011 | Ryu et al. |
| 2012/0217594 A1 | 8/2012 | Kajiyama |
| 2012/0326252 A1* | 12/2012 | Yamakawa et al. ........... 257/421 |
| 2013/0062714 A1 | 3/2013 | Zhu et al. |

FOREIGN PATENT DOCUMENTS

| | | |
|---|---|---|
| JP | 2009194210 A | 8/2009 |
| JP | 2010165790 A | 7/2010 |
| JP | 2012182219 A | 9/2012 |

OTHER PUBLICATIONS

Z. R. Tadisina, A. Natarajarathinam, and S. Gupta "Magnetic tunnel junctions with Co-based perpendicular magnetic anisotropy multilayer's" J. Vac. Sci. Technol. A 28(4) Jul./Aug. 2010, pp. 973-978.

* cited by examiner

METHOD OF FABRICATING A MAGNETIC TUNNEL JUNCTION (MTJ) DEVICE WITH REDUCED SWITCHING CURRENT

CROSS REFERENCE TO RELATED APPLICATIONS

The present application is a divisional of U.S. patent application Ser. No. 13/358,694, to Zhu et al., filed on Jan. 26, 2012, now U.S. Pat. No. 8,704,320, which claims the benefit of U.S. Provisional Patent Application No. 61/533,413 to ZHU et al., filed on Sep. 12, 2011, the disclosures of which are expressly incorporated herein by reference in their entireties.

TECHNICAL FIELD

The present disclosure generally relates to spin-transfer-torque magnetic random access memory (STT-MRAM). More specifically, the present disclosure relates to directing internal strain and stress to reduce STT-MRAM switching current.

BACKGROUND

Unlike conventional random access memory (RAM) chip technologies, in magnetic RAM (MRAM) data is not stored as electric charge but is instead stored by magnetic polarization of storage elements. The storage elements are formed from two ferromagnetic layers separated by a tunneling barrier layer. One of the two layers, called the fixed layer, has at least one reference magnetic polarization set to a particular polarity. The magnetic polarity of the other magnetic layer, called the free layer, is altered to represent either a "1" (e.g., anti-parallel to the fixed reference layer) or "0" (e.g., parallel to the fixed reference layer). One such device having a fixed layer, a tunneling barrier layer, and a free layer is a magnetic tunnel junction (MTJ). The electrical resistance of an MTJ is dependent on the magnetic polarity of the free layer compared to the magnetic polarity of the fixed layer. A memory device such as MRAM is built from an array of individually addressable MTJs.

To write data in a conventional MRAM, a write current is applied through an MTJ. The write current has a magnitude exceeding a level called the critical switching current level which is sufficient to change the orientation of spin or magnetization in the free layer. When the write current flows in a first direction, the MTJ can be placed into or remain in a first state, where its magnetizations are in a parallel orientation. When the write current flows in a second direction, opposite to the first direction, the MTJ can be placed into or remain in a second state, where its magnetizations are in an anti-parallel orientation.

To read data in a conventional MRAM, a read current may flow through the MTJ via the same current path used to write data in the MTJ. If the magnetizations of the MTJ are in a parallel orientation, the MTJ presents a resistance that is different than the resistance the MTJ would present if the magnetizations of the MTJ element were in an anti-parallel orientation. Thus, in a conventional MRAM, there are two distinct states defined by two different resistances, and logic "0" or a logic "1" value can be read based on the state.

Bitcells of a magnetic random access memory may be arranged in one or more arrays including a pattern of memory elements (e.g., MTJs in case of MRAM). STT-MRAM (Spin-Transfer-Torque Magnetic Random Access Memory) is an emerging nonvolatile memory that has advantages of non-volatility, comparable speed to eDRAM (Embedded Dynamic Random Access Memory), smaller chip size compared to eSRAM (Embedded Static Random Access Memory), unlimited read/write endurance, and low array leakage current.

In one category of MRAM memory cells, the direction of polarization of the free layer and the reference layer of a magnetic tunnel junction (MTJ) is parallel to the plane of the respective layer. Such memory cells are referred to as having in-plane magnetic anisotropy or longitudinal magnetic anisotropy (LMA). In another category of MRAM memory cells, the direction of polarization of the free layer and reference layer of an MTJ is perpendicular to the plane of the respective layer. Such memory cells are referred to as having perpendicular magnetic anisotropy (PMA).

The critical switching current, which is the amount of electrical current that can cause an MRAM memory cell to change from one logical state to another, is also referred to as the switching current of the memory cell. PMA type memory cells use less switching current than LMA type memory cells. It would be desirable to improve the perpendicular magnetic anisotropy of MRAM memory cells to produce MRAM devices with reduced power consumption.

SUMMARY

Aspects of the present disclosure increase perpendicular magnetic anisotropy of layers in an MTJ by applying a mechanical stress/strain to the MTJ. According to aspects of the present disclosure, an MTJ may be fabricated using processes and structural configurations that induce a directed static stress/strain on an MTJ to increase the perpendicular magnetic anisotropy and, as a consequence, reduce switching current of the MTJ. The directed static strain/stress on the MTJ may be induced in a controlled direction and/or with a controlled magnitude during fabrication of the MTJ according to aspects of the present disclosure. An MTJ fabricated according to aspects of the present disclosure is permanently subject to a predetermined directed stress and permanently includes the directed static strain/stress that provides reduced switching current.

A magnetic tunnel junction (MTJ) device according to one aspect of the present disclosure includes an MTJ configured with a fixed layer, a free layer; and a barrier layer between the fixed layer and the free layer. The device also includes a stress-strain film against the MTJ. The stress-strain film is patterned to induce a directed static strain and/or stress in the MTJ.

One aspect of the present disclosure includes a method fabricating a MTJ device with reduced switching current. The method includes depositing an MTJ film, patterning the MTJ film to form an MTJ and depositing a stress-strain film against the MTJ. The stress-strain film is patterned to induce a directed stress and/or strain in the MTJ.

According to an aspect of the present disclosure, a magnetic memory apparatus has means for fixing magnetization in a first layer, and means for providing tunneling magnetoresistance (TMR) in a second layer. The apparatus also has means changing a direction of magnetization in a third layer. The apparatus also has means for directing a stress/strain to the third layer. The means for directing a stress/strain is configured to reduce a switching current of the apparatus.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Aspects of the present disclosure increase perpendicular magnetic anisotropy of layers in an MTJ by applying a mechanical strain/stress to the MTJ. According to aspects of the present disclosure, an MTJ may be fabricated using processes and structural configurations that induce a directed static strain on an MTJ to increase the perpendicular magnetic anisotropy and as a consequence, reduce switching current of the MTJ. The directed static strain/stress on the MTJ may be induced in a controlled direction and/or with a controlled magnitude during fabrication according to aspects of the present disclosure. An MTJ fabricated according to aspects of the present disclosure is permanently subject to a predetermined directed stress and permanently includes the directed static strain/stress that provides reduced switching current.

Anisotropy may be induced by application of mechanical stress and strain on an MTJ. The magnitude of anisotropy that may be induced by stress and strain also depends on the magnetostriction of the material under stress as described by the equation for magnetoelastic energy:

$$E = \frac{3}{2}\lambda\sigma\sin^2\theta$$

where $\lambda$ represents the magnetostriction of a material, $\sigma$ represents strain/stress applied to the material, and $\theta$ represents the angle between the strain/stress and the magnetization. It should be understood that the term strain includes stress. The magnitude of magnetic anisotropy induced by stress is proportional to the magnetostriction times the strain/stress as described by the equation: $K=3/2\lambda\sigma$. If $\lambda\sigma>0$, the magnetic moments in a layer are constrained along the $\theta=0$) axis, i.e., the same direction as the strain/stress applied direction. If $\lambda\sigma<0$, the magnetic moments in the layer are constrained perpendicular to the $\theta=0$ axis, i.e., perpendicular to the applied stress/strain direction.

The magnetostriction ($\lambda$) of a material depends in part on the composition of the material. For example, in a layer of CoNiB or CoFeB, the magnetostriction can be increased by decreasing the amount of Co in the material composition. According to aspects of the disclosure, an STT-MRAM MTJ free layer magnetostriction can be controlled by controlling its thickness and material composition. For example reducing the thickness of the free layer significantly increases magnetostriction.

Figure 1:
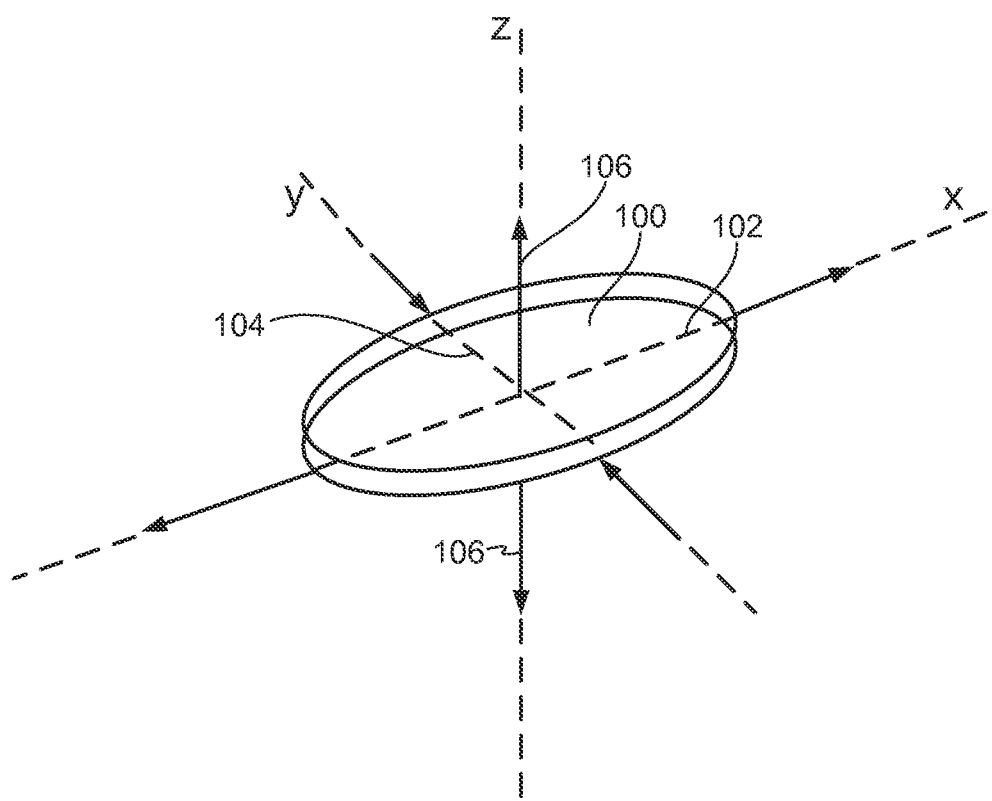
FIG. 1 is a top perspective diagram of a magnetic tunnel junction (MTJ) with directed stress/strain according to aspects of the present disclosure.

Perpendicular anisotropy may be induced by stress/strain according to aspects of the present disclosure as described with reference to FIG. 1. An MTJ 100 is deposited in the x-y plane and is elongated along the x axis so that the MTJ has a long axis 102 and a short axis 104. To generate a perpendicular anisotropy in a magnetic free layer with positive magnetostriction, a tensile stress is applied out of plane, i.e., along the z axis, to provide perpendicular tensile strain (a) 106. At the same time, an in-plane tensile stress can be applied along the long axis 102 to provide a tensile strain along the long axis 102, which can increase the thermal stability of the MTJ 100. Additionally, according to aspects of the present disclosure, an in-plane compressive stress may be applied to provide a compressive stress in plane which increases the perpendicular anisotropy of the MTJ 100 even further. Particularly, an in-plane compressive stress may be applied along the short axis 104 which may increase both the perpendicular anisotropy and thermal stability of the MTJ 100.

The perpendicular anisotropy induced by properly applied stress and strain according to aspects of the present disclosure increases linearly with the magnitude of the applied stress and strain. Switching current is significantly reduced in the MTJ 100 as a result of the perpendicular anisotropy induced by stress/strain according to aspects of the present disclosure. The perpendicular anisotropy induced by stress and strain does not change the switching field or the thermal stability of the MTJ. The STT-MRAM MTJ thermal stability may also improved by applying a tensile strain along its long axis or by applying a compressive stress along its short axis according to aspects of the present disclosure.

The stress and strain in an MTJ can be applied by controlling fabrication integration processes to purposely introduce a stress and strain to layers of the MTJ in the desired directions. The magnitude of stresses applied to various layers in an MTJ can be controlled in several ways during fabrication of the MTJ. For example, the stress magnitude can be controlled by providing particular film thicknesses. The STT-MRAM MTJ free layer stress can be controlled by selection of its thickness and materials. In one example, decreasing free layer thickness significantly increases stress and strain in the free layer. In another example, a Ta capping stress can be significantly increased by reducing the Ta capping thickness.

The magnitude of the applied stress in an MTJ can also be controlled by controlling the atmosphere that is used in the fabrication process. For example, varying amounts of Ar or Kr in the fabrication atmosphere may vary the magnitude of stresses in MTJs being fabricated. The stress magnitude can also be controlled by controlling film deposition speed during the deposition processes of MTJ fabrication. Stress magnitude can also be controlled by controlling the film deposition pressure during fabrication. Yet another method of controlling stress in an MTJ according to aspects of the present disclosure includes controlling the substrate bias voltage during film deposition.

According to aspects of the present disclosure, the STT-MRAM MTJ free layer stress can be controlled by including capping layers above and below the free layer. For example, the size of free layer capping on both sides of free layer can be made either equal to the free layer size or different from the free layer size to provide a desired stress/strain.

According to aspects of the present disclosure, an STT-MRAM MTJ free layer can be an alloy of CoFeB—X to induce stress. X can be one of Ta, Ru, MgO, Mg, Cr, Pt, Pd, Cu, Al, AlOx, TaN, NiFe, Fe, Ti, TiN, Co, Ni, B. N etc. X can also be two or more than two combinations of Ta, Ru, MgO, Mg, Cr, Pt, Pd, Cu, Al, AlOx, TaN, NiFe, Fe, Ti, TiN, Co, Ni, B, N etc. CoFeB and X can become an intermixing layer. The STT-MRAM MTJ free layer may also be multi-layer films to induce stress. The multi-layer films can have repeated structure. For example, the free layer can be (CoFeB/Ta/CoFeB)xN or (CoFeB/Ta/NiFe)xN.

According to aspects of the disclosure, a desired stress/strain can be applied in a desired direction by purposely controlling STT-MRAM MTJ capping material and fabrication methods such as thickness, deposition speed and/or air flow, for example. In one example, Ta deposited in a fast Ar flow can introduce over 1 GPa tensile stress on the MTJ free layer to reduce switching current. The use of a thinner Ta capping layer may provide an even larger stress, for example. According to aspects of the disclosure, the capping material can be one of Ta, Ru, MgO, Mg, Cr, Pt, Pd, Cu, Al, AlOx, TaN, NiFe, Fe, Ti, TiN, Co, Ni, B, N, for example. The capping may alternatively be multi-layer capping consisting of different materials such as two or more than two combinations of Ta, Ru, MgO, Mg, Cr, Pt, Pd, Cu, Al, AlOx, TaN, NiFe, Fe, Ti, TiN, Co, Ni, B, N, for example. The capping layers can be at the bottom of the free layer or on top of the free layer or both.

Figure 2A:
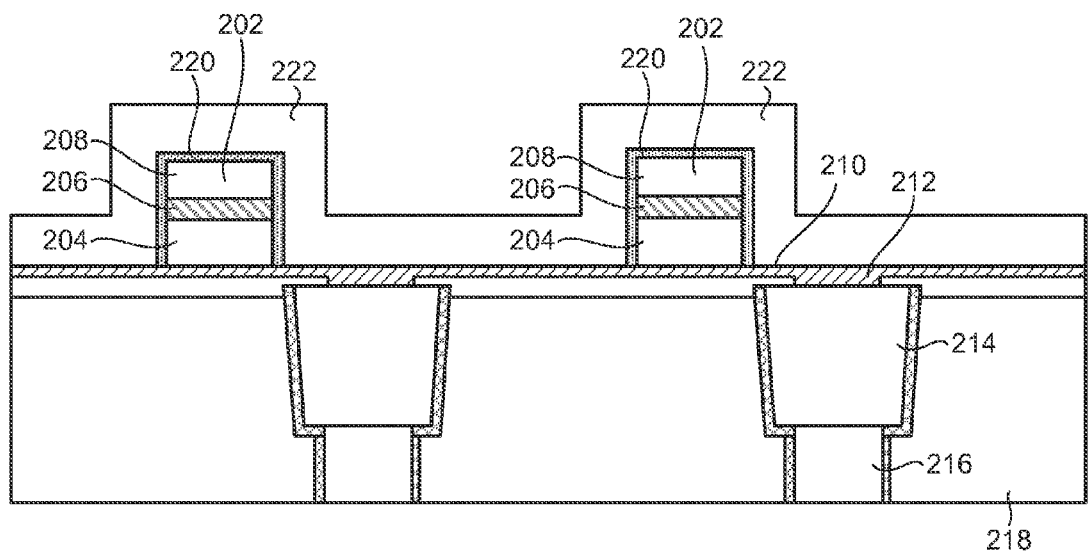
FIGS. 2A-2D are cross-sectional diagrams of a magnetic tunnel junction fabricated according to aspects of the present disclosure.

FIGS. 2A-2D show a fabrication process in which a directed stress/strain is provided by patterning an MTJ film and then depositing an MTJ cap film and an oxide film according to one aspect of the present disclosure. In FIG. 2A, the MTJ 202 including a fixed layer 204, a barrier layer 206 and a free layer 208 is deposited on a substrate. The substrate includes a bottom electrode 210, a bottom electrode contact 212, bottom metal 214 and a contact via 216 through an inter-layer dielectric (ILD) or inter-metal dielectric (IMD) 218. According to this process, the MTJ is patterned and then an MTJ cap film 220 is deposited over the MTJ. The MTJ cap film 220 may be SiN for example. An oxide film 222 is then deposited over the MTJ cap film 220 covering the MTJ 202 and bottom electrode 210.

Figure 2B:
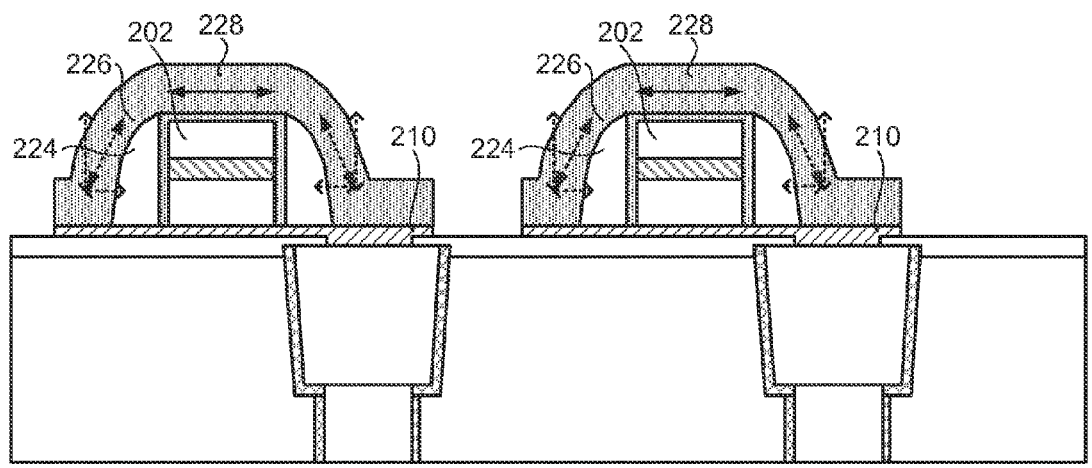

Referring to FIG. 2B, the oxide film 222 is etched back to form an oxide spacer 224. In this example, etching the oxide film 222 forms an oxide spacer 224 with an angled surface 226. A first stress-strain film 228 is deposited on top of the oxide spacer 224 and the MTJ 202. The first stress-strain film 228 may be SiN, SiC, or SiGe, for example. The first stress-strain film 228 is then patterned. In this example, the first stress-strain film 228 is used as a hard mask to pattern the bottom electrode 210. A second stress-strain film (not shown) may optionally be deposited and patterned over the first stress-strain film 228.

Figure 2C:
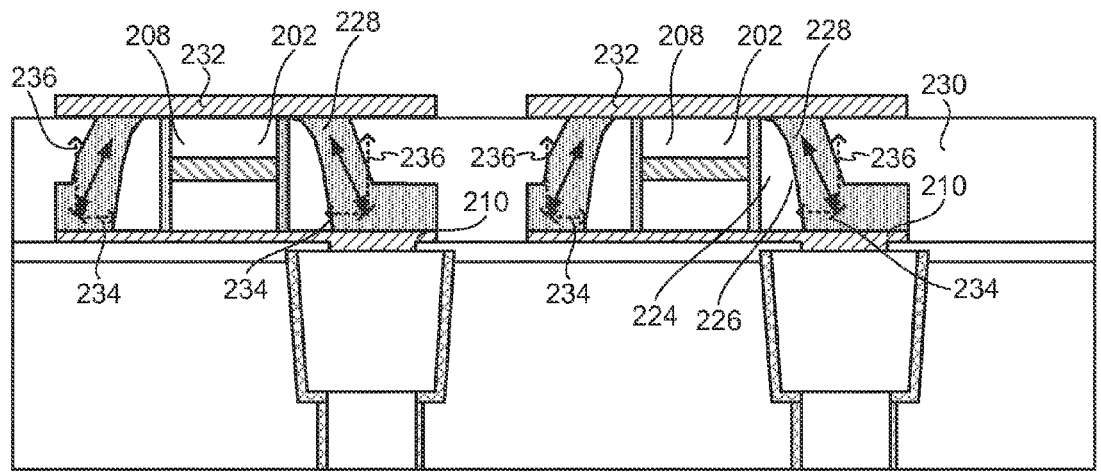

Referring to FIG. 2C, an oxide layer or low-k oxide film 230 is then deposited. The oxide layer or low-k oxide film 230 is then planarized along with the first stress-strain film 228 and optional second stress-strain film (not shown) to open the top of the MTJ. The planarization may be performed by chemical-mechanical planarization (CMP) or spin-on material (SOM) etch back, for example. A top electrode film 232 is deposited and patterned over the planarized MTJ 202 and first stress-strain film 228. The angled surface 226 of the oxide spacer 224 directs stresses in the stress-strain film 228 so that the stress-strain film 228 applies an in-plane stress component 234 and a perpendicular stress component 236 on the free layer 208 to reduce switching current of the MTJ 202.

Figure 2D:
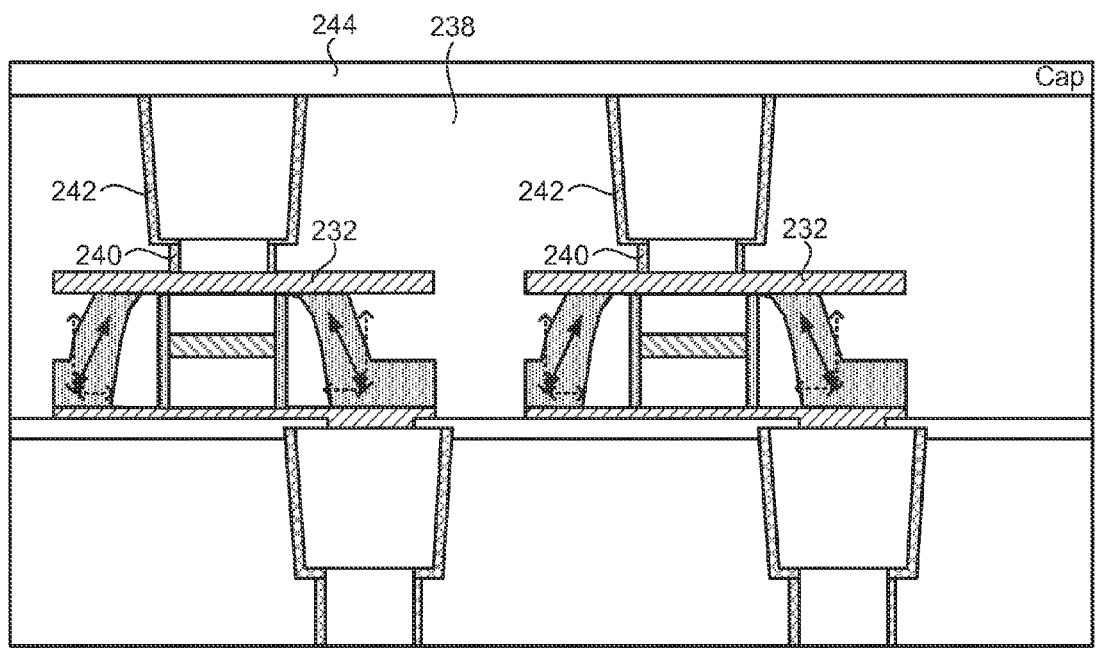

Referring to FIG. 2D, a low-k oxide film 238 is deposited and planarized over the top electrode 232. A Damascene trench process patterns a top via 240 and top metal 242. A cap film 244 is deposited over the top metal 242 and low-k oxide film 238.

Figure 3A:
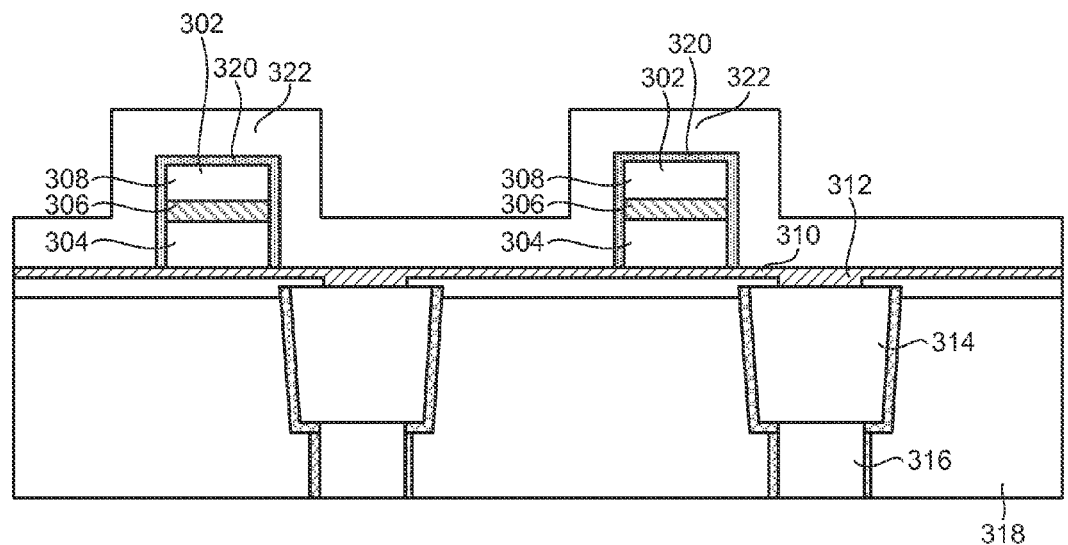
FIGS. 3A-3D are cross-sectional diagrams of a magnetic tunnel junction fabricated according to aspects of the present disclosure.

FIGS. 3A-3D show a fabrication process in which a directed stress/strain is provided by patterning an MTJ film and then depositing an MTJ cap film and an oxide film according to another aspect of the present disclosure. In FIG. 3A, The MTJ 302 including a fixed layer 304, a barrier layer 306 and a free layer 308 is deposited on a substrate. The substrate includes a bottom electrode 310, a bottom electrode contact 312, bottom metal 314 and a contact via 316 through an ILD or IMD. 318. According to this process, The MTJ is patterned and then an MTJ cap film 320 is deposited over the MTJ. The MTJ cap film 320 may be SiN for example. An oxide film 322 is then deposited over the MTJ cap film 320 covering the MTJ 302 and bottom electrode 310.

Figure 3B:
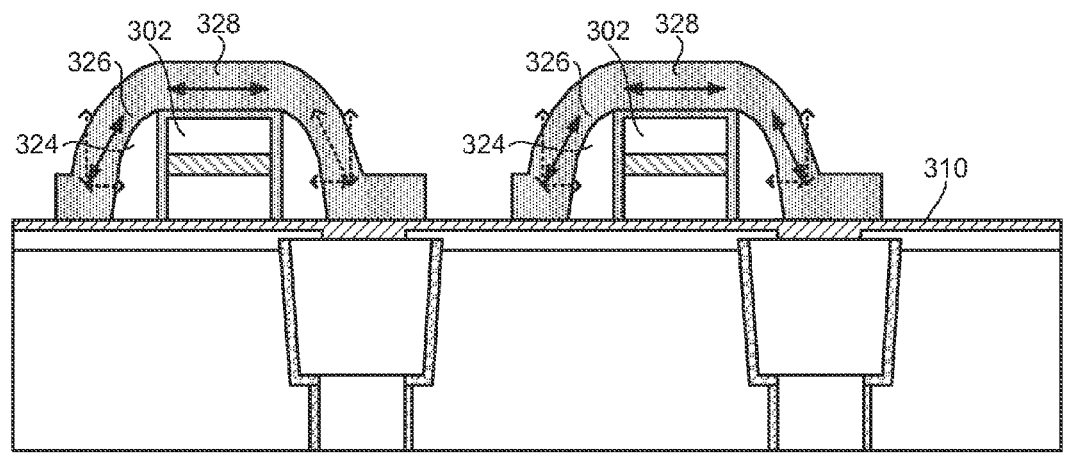

Referring to FIG. 3B, the oxide film 322 is etched back to form an oxide spacer 324. In this example, etching the oxide film 322 forms an oxide spacer 324 with an angled surface 326. A first stress-strain film 328 is deposited on top of the oxide spacer 324 and the MTJ 302. The first stress-strain film 328 may be SiN, SiC, or SiGe, for example. The first stress-strain film 328 is then patterned. In this example, the first stress-strain film 328 is not used as a hard mask to pattern the bottom electrode 310. A second stress-strain film (not shown) may optionally be deposited and patterned over the first stress-strain film 328.

Figure 3C:
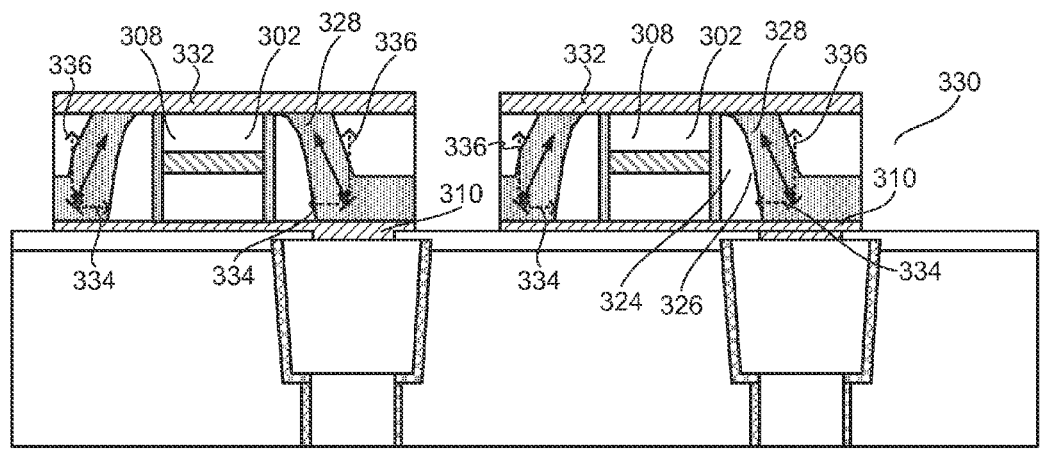

Referring to FIG. 3C, an oxide layer or low-k oxide film 330 is then deposited. The oxide layer or low-k oxide film 330 is then planarized along with the first stress-strain film 328 and optional second stress-strain film (not shown) to open the top of the MTJ. The planarization may be performed by CMP or SOM etch back, for example. A top electrode film 332 is deposited over the planarized MTJ 302 and first stress-strain film 328. The top electrode film 332 and bottom electrode 310 are then patterned. The angled surface 326 of the oxide spacer 324 directs stresses in the stress-strain film 328 so that the stress-strain film 328 applies an in-plane stress component 334 and a perpendicular stress component 336 on the free layer 308 to reduce switching current of the MTJ 302.

Figure 3D:
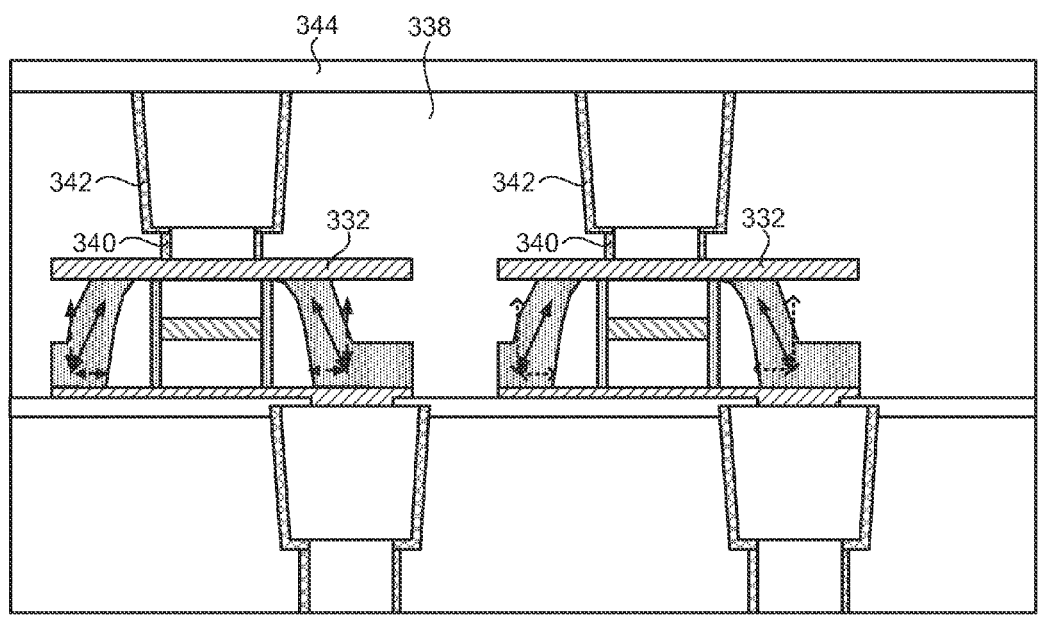

Referring to FIG. 3D, a low-k oxide film 338 is deposited and planarized over the top electrode 332. A Damascene trench process patterns a top via 340 and top metal 342. A cap film 344 is deposited over the top metal 342 and low-k oxide film 338.

Figure 4A:
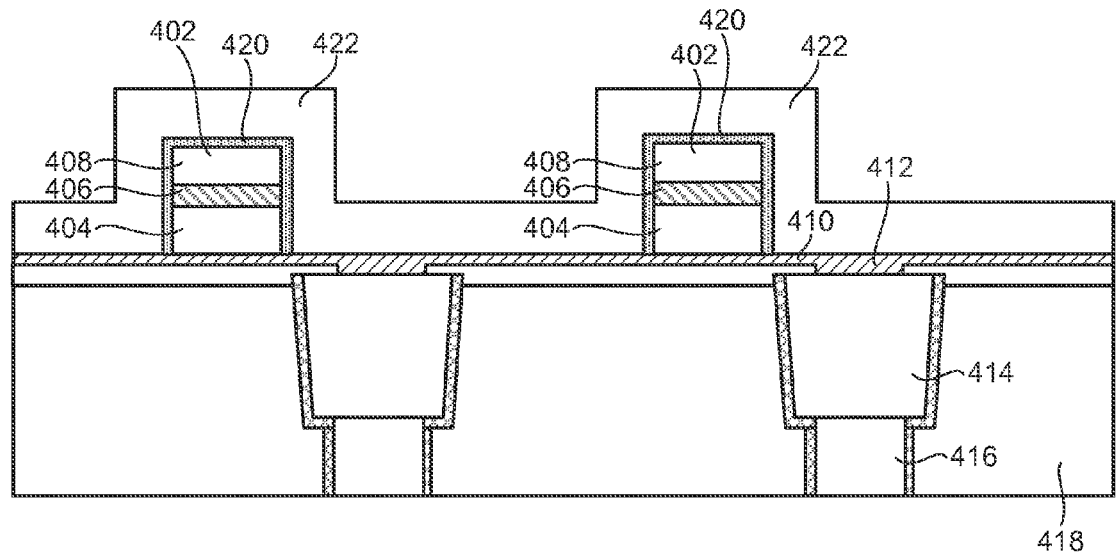
FIGS. 4A-4D are cross-sectional diagrams of a magnetic tunnel junction fabricated according to aspects of the present disclosure.

FIGS. 4A-4D show a fabrication process in which a directed stress/strain is provided by patterning an MTJ film and then depositing an MTJ cap film and an oxide film according to another aspect of the present disclosure. In FIG. 4A, The MTJ 402 including a fixed layer 404, a barrier layer 406 and a free layer 408 is deposited on a substrate. The substrate includes a bottom electrode 410, a bottom electrode contact 412, bottom metal 414 and a contact via 416 through an ILD or IMD. 418. According to this process, The MTJ is patterned and then an MTJ cap film 420 is deposited over the MTJ. The MTJ cap film 420 may be SiN for example. An oxide film 422 is then deposited over the MTJ cap film covering the MTJ 402 and bottom electrode 410.

Figure 4B:
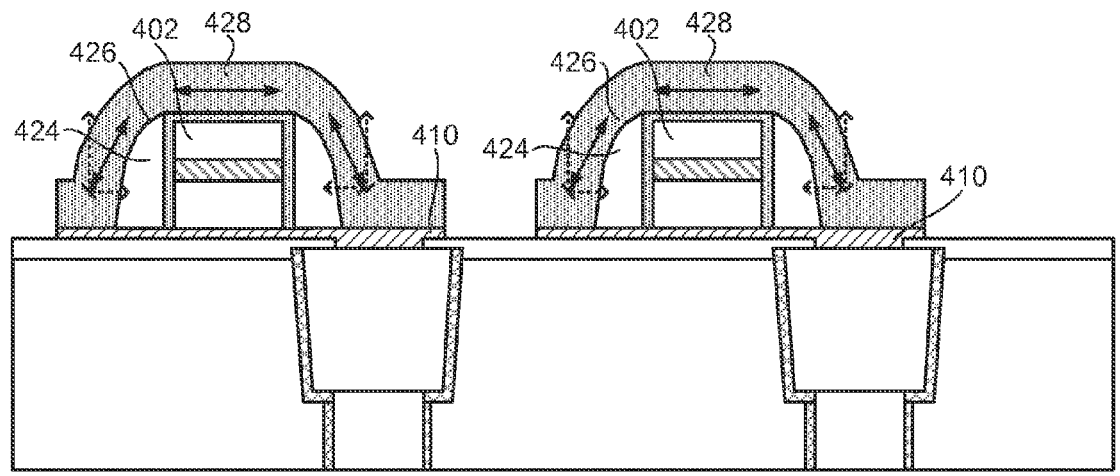

Referring to FIG. 4B, the oxide film 422 is etched back to form an oxide spacer 424. In this example, etching the oxide film 422 forms an oxide spacer 424 with an angled surface 426. A first stress-strain film 428 is deposited on top of the oxide spacer 424 and the MTJ 402. The first stress-strain film 428 may be SiN, SiC, or SiGe, for example. The first stress-strain film 428 is then patterned. In this example, the first stress-strain film 428 is used as a hard mask to pattern the bottom electrode 410. A second stress-strain film (not shown) may optionally be deposited and patterned over the first stress-strain film 428.

Figure 4C:
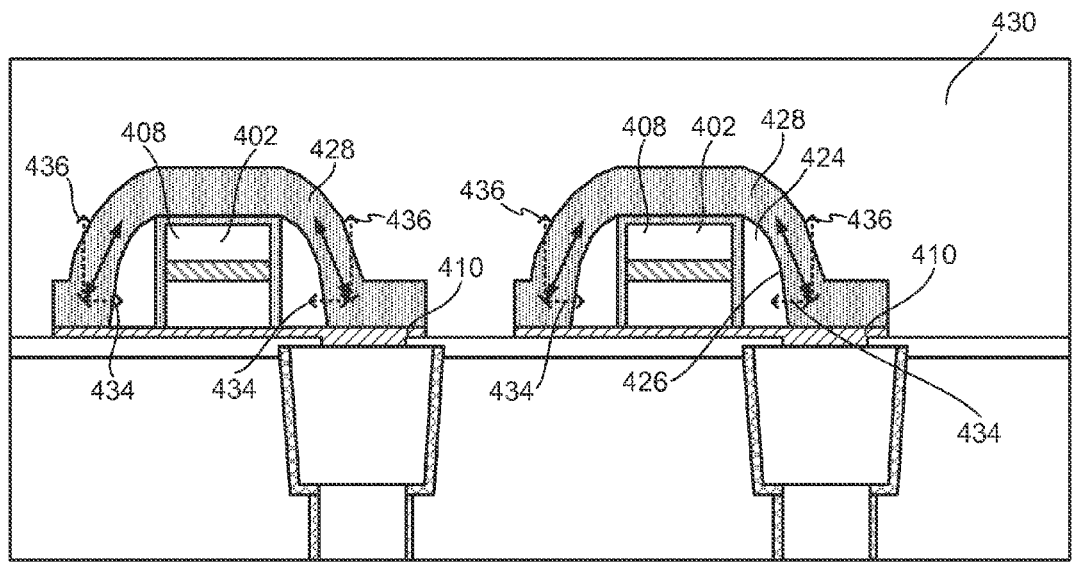

Referring to FIG. 4C, an oxide layer or low-k oxide film 430 is then deposited. The oxide layer or low-k oxide film 430 is then planarized leaving the stress-strain film 428 over the MTJ 402. The planarization may be performed by CMP or SOM etch back, for example. The angled surface 426 of the oxide spacer 424 directs stresses in the stress-strain film 428 so that the stress-strain film 428 applies an in-plane stress component 434 and a perpendicular stress component 436 on the MTJ 402 to reduce switching current of the MTJ 402.

Figure 4D:
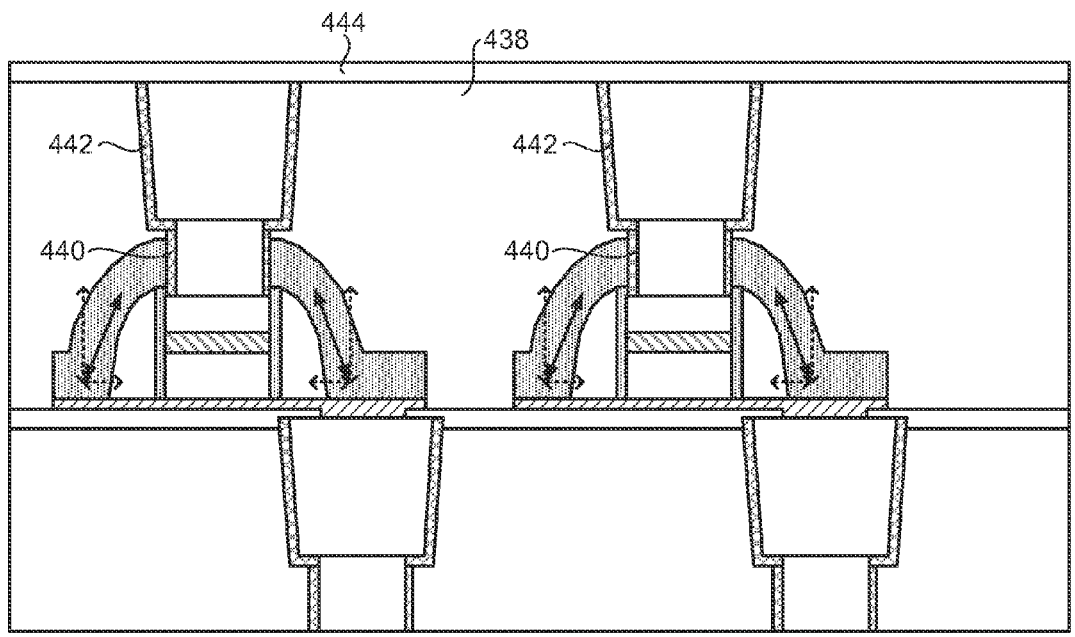

Referring to FIG. 4D, a Damascene trench process patterns a top via 440 and top metal 442. A cap film 444 is deposited over the top metal 442. The top via 440 directly couples to the free layer 408.

Figure 5A:
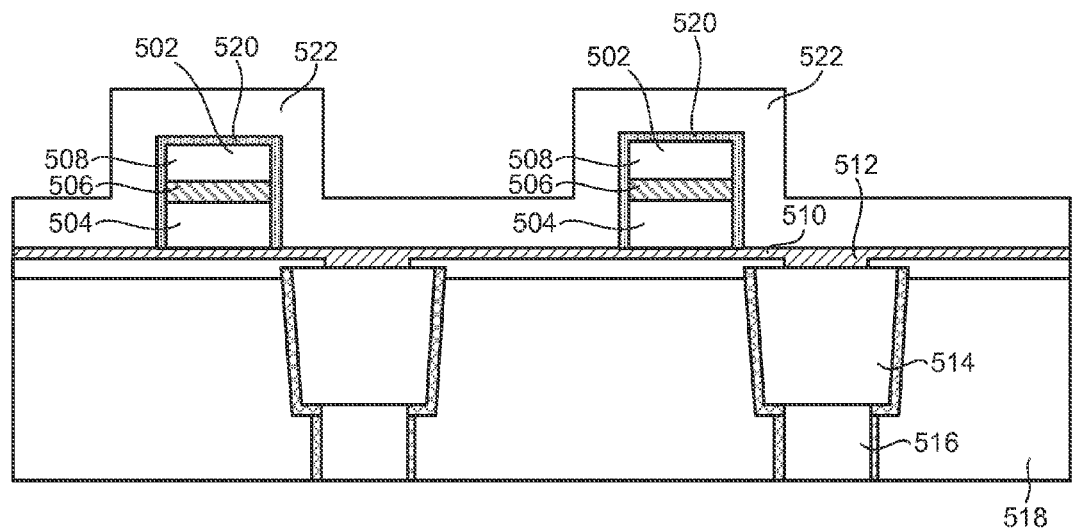
FIGS. 5A-5D are cross-sectional diagrams of a magnetic tunnel junction fabricated according to aspects of the present disclosure.

FIGS. 5A-5D show a fabrication process in which a directed stress/strain is provided by patterning an MTJ film and then depositing an MTJ cap film and an oxide film according to another aspect of the present disclosure. In FIG. 5A, The MTJ 502 including a fixed layer 504, a barrier layer 506 and a free layer 508 is deposited on a substrate. The substrate includes a bottom electrode 510, a bottom electrode contact 512, bottom metal 514 and a contact via 516 through an ILD or IMD. 518. According to this process, The MTJ is patterned and then an MTJ cap film 520 is deposited over the MTJ. The MTJ cap film 520 may be SiN, for example. An oxide film 522 is then deposited over the MTJ cap film covering the MTJ 502 and bottom electrode 510.

Figure 5B:
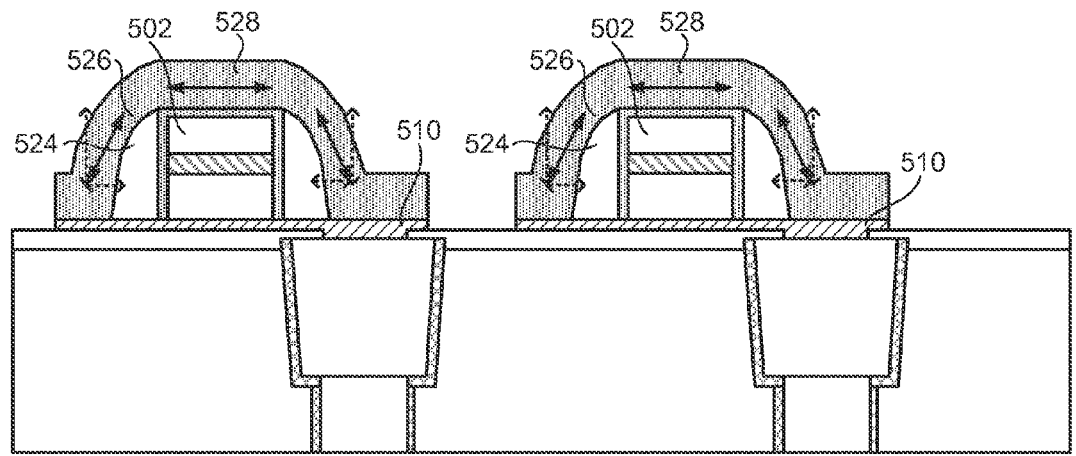

Referring to FIG. 5B, the oxide film 522 is etched back to form an oxide spacer 524. In this example, etching the oxide film 522 forms an oxide spacer 524 with an angled surface 526. A first stress-strain film 528 is deposited on top of the oxide spacer 524 and the MTJ 502. The first stress-strain film 528 may be SiN, SiC, or SiGe, for example. The first stress-strain film 528 is then patterned. In this example, the first stress-strain film 528 is used as a hard mask to pattern the bottom electrode 510. A second stress-strain film (not shown) may optionally be deposited and patterned over the first stress-strain film 528.

Figure 5C:
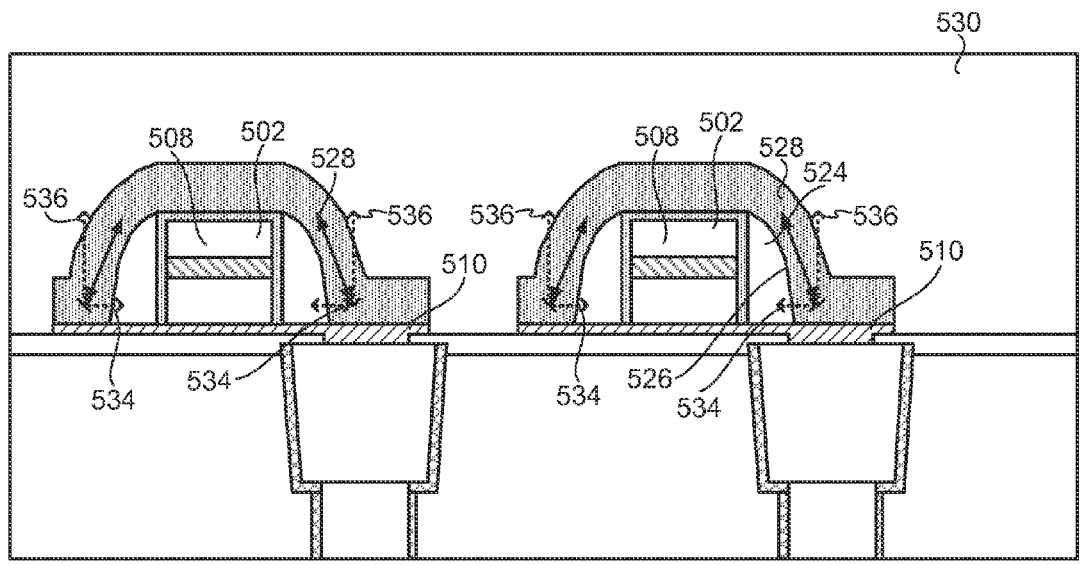

Referring to FIG. 5C, an oxide layer or low-k oxide film 530 is then deposited. The oxide layer or low-k oxide film 530 is planarized leaving the stress-strain film 528 over the MTJ 502. The planarization may be performed by CMP or SOM etch back, for example. The angled surface 526 of the oxide spacer 524 directs stresses in the stress-strain film 528 so the stress-strain film 528 applies an in-plane stress component 534 and a perpendicular stress component 536 on the MTJ 502 to reduce switching current of the MTJ 502.

Figure 5D:
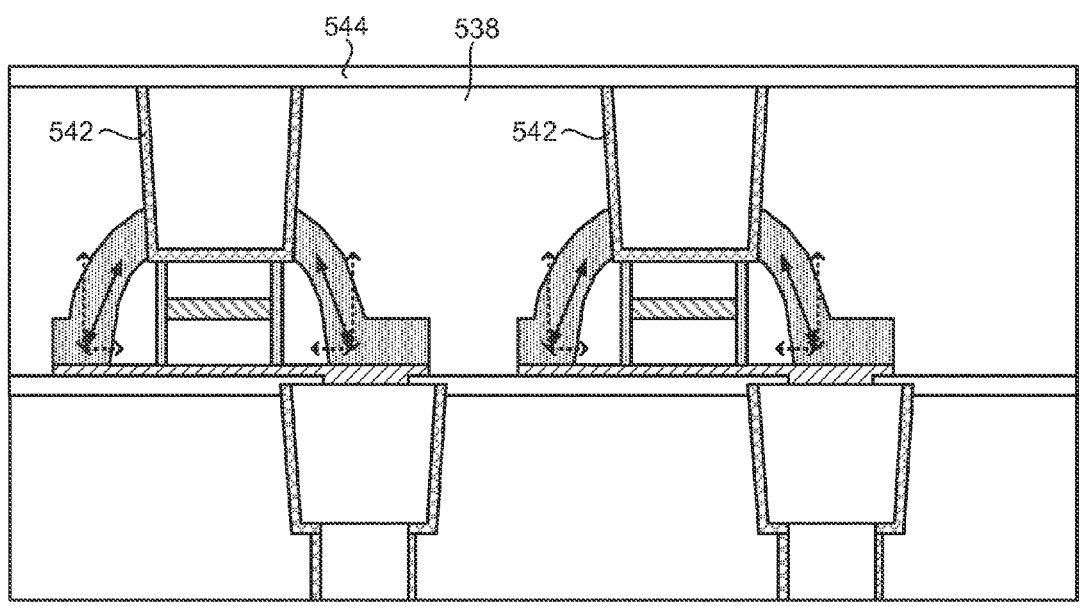

Referring to FIG. 5D, a Damascene trench process patterns a top metal 542, which directly couples to the free layer. A cap film 544 is deposited over the top metal 542.

Figure 6A:
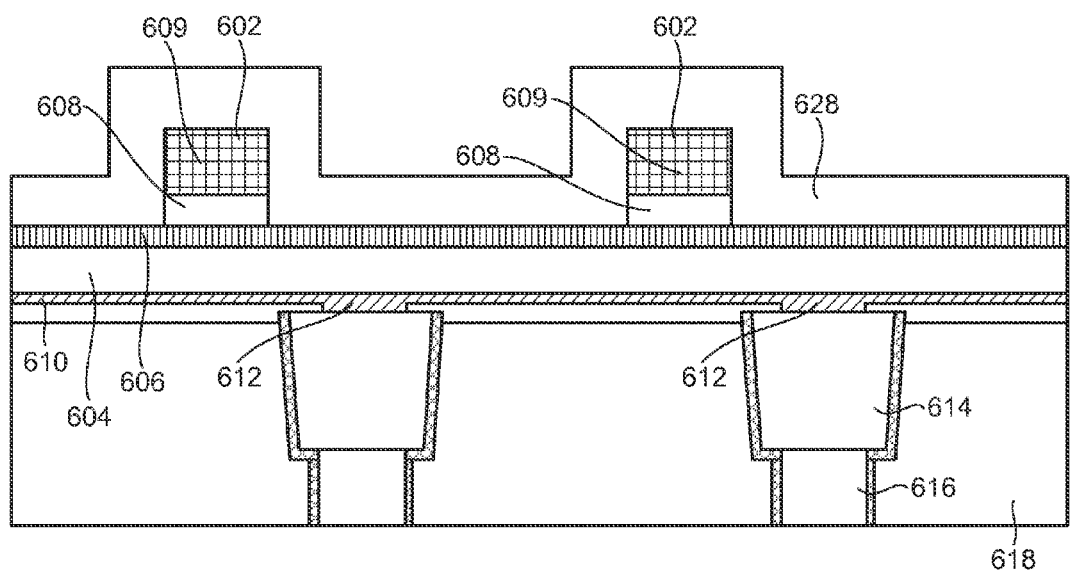
FIGS. 6A-6D are cross-sectional diagrams of a magnetic tunnel junction fabricated according to aspects of the present disclosure.

FIGS. 6A-6D shows a fabrication process in which a directed stress/strain is provided by depositing a stress-strain film against the free layer according to another aspect of the present disclosure. In FIG. 6A, The MTJ 602 including a fixed layer 604, a barrier layer 606 and a free layer 608 is deposited on a substrate. A hardmask 609 is deposited over the free layer. The hardmask may be Ta or Ti, for example. The substrate includes a bottom electrode 610, a bottom electrode contact 612, bottom metal 614 and a contact via 616 through an ILD or IMD 618.

According to this process, the MTJ is patterned in two steps. In a first MTJ patterning stage, the free layer 608 and Ta hardmask 609 are patterned. Etching is stopped at the barrier layer 606. Optionally etching may be stopped at the fixed layer 604 to also pattern the barrier layer 606 in the first MTJ patterning step (not shown). A stress-strain film 628 is deposited over the patterned hardmask 609, free layer 608, and optionally over the patterned barrier layer 606.

Figure 6B:
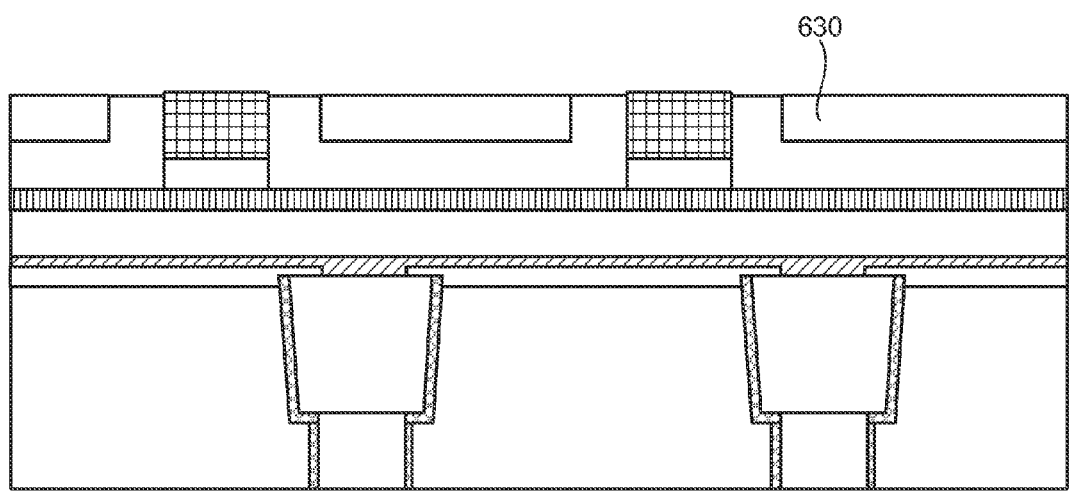

Referring to FIG. 6B, an oxide layer or low-k oxide film 630 is then deposited. The oxide layer or low-k oxide film 630 is then planarized along with the stress-strain film 628 and hardmask 609 to expose the hardmask 609. The planarization may be performed by CMP or SOM etch back, for example.

Figure 6C:
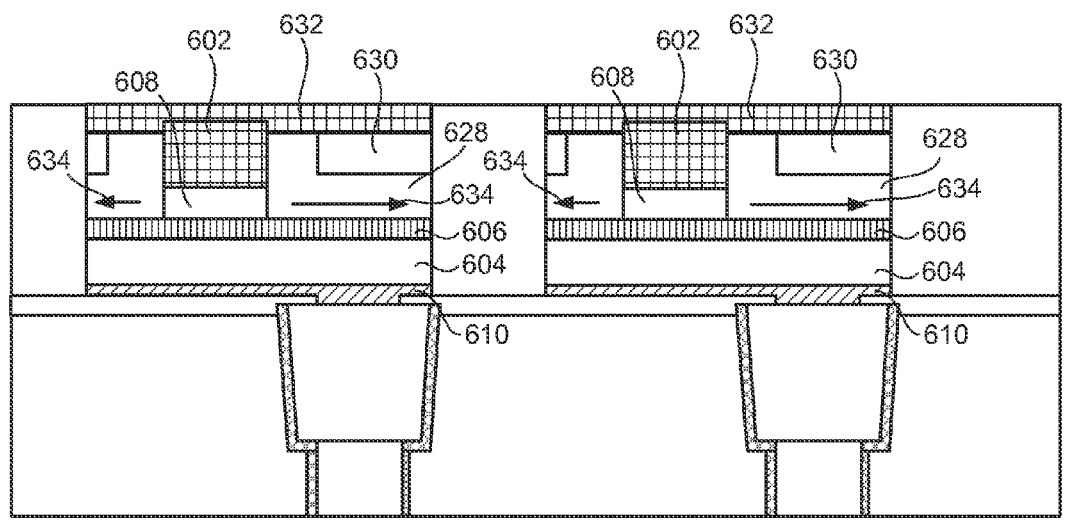

Referring to FIG. 6C, a top electrode film 632 is then deposited over the planarized oxide film 630. The top electrode 632 is patterned along with the stress-strain film 628, the fixed layer 604 and the bottom electrode 610. The barrier layer 606 is also patterned in this step if it was not already patterned in the first MTJ patterning step. The stress-strain film 628 applies an in-plane stress component 634 on the free layer 608 to reduce switching current of the MTJ 602.

Figure 6D:
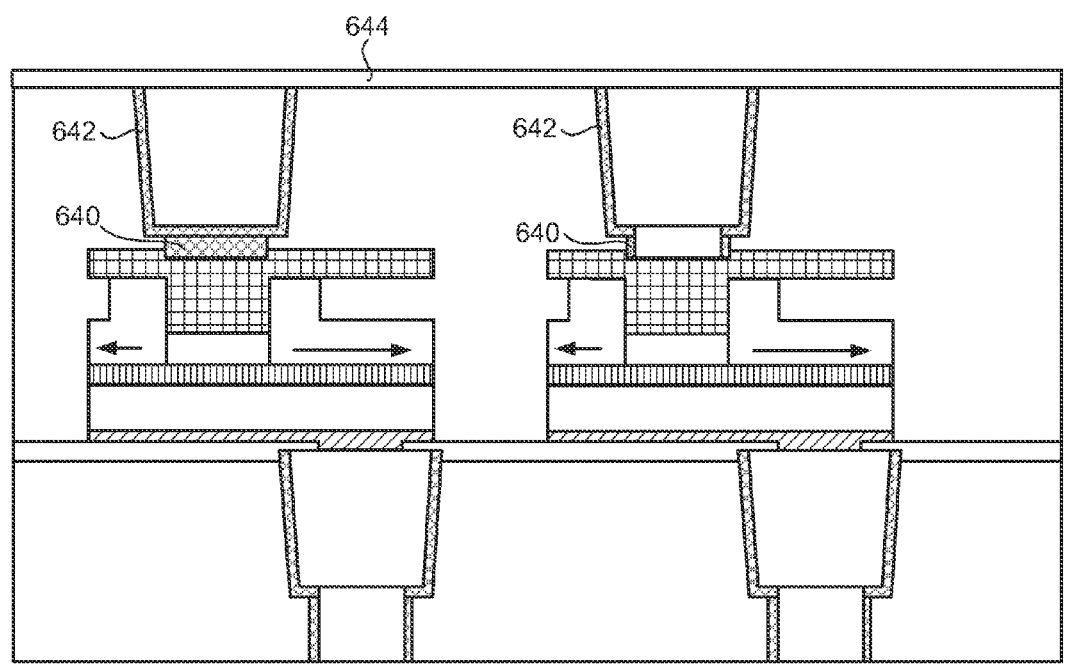

Referring to FIG. 6D, a Damascene trench process patterns a top via 640 and a top metal 642. A cap film 644 is deposited over the top metal 642.

Figure 7A:
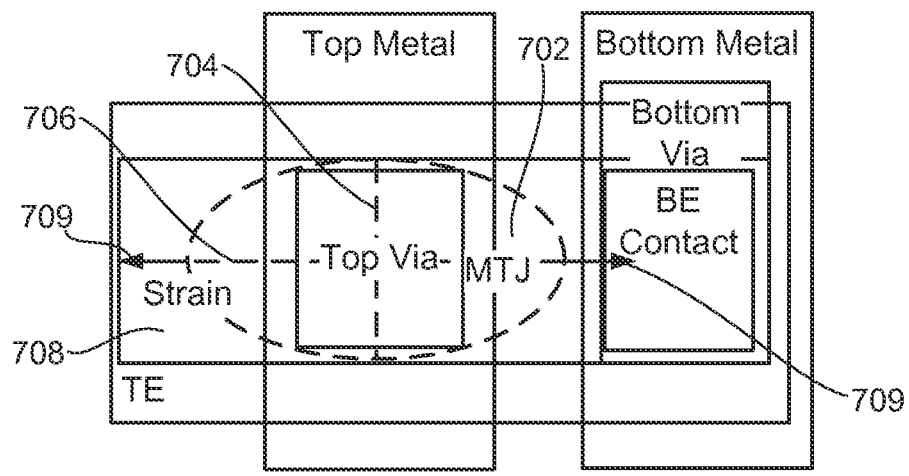
FIGS. 7A and 7B are top view diagrams of a magnetic tunnel junction fabricated according to aspects of the present disclosure.
Figure 7B:
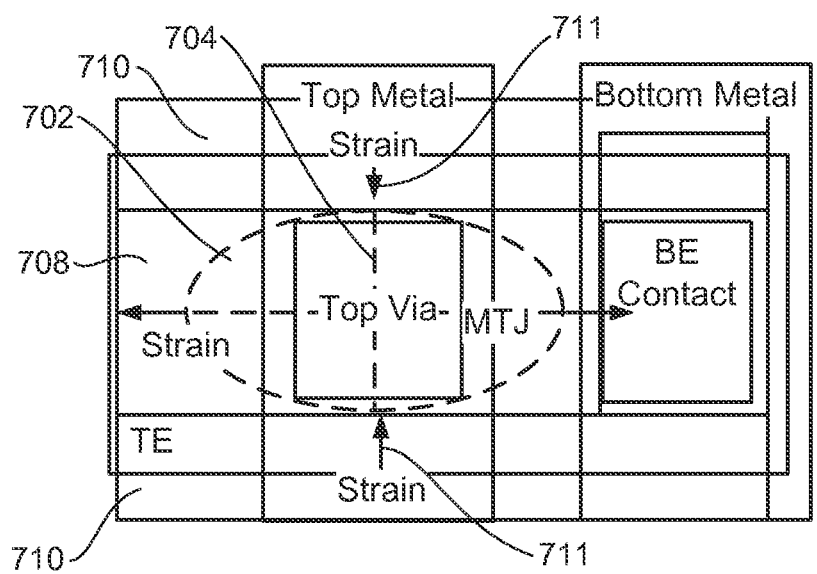

FIGS. 7A and 7B show top views of an STT MRAM MTJ to illustrate a fabrication process that provides in-plane directed stress/strain according to aspects of the present disclosure. Referring to FIG. 7A, an MTJ 702 includes a short axis 704 and a long axis 706. A first stress-strain film 708 is deposited, as described above with reference to FIGS. 2A-6D, for example. The first stress-strain film 708 is a material and/or thickness that provides a tensile stress. The first stress-strain film 708 is then patterned into an elongated strip along the long axis 706 of the MTJ 702. The first stress-strain film 708 directs a tensile stress 709 along the long axis 706.

Referring to FIG. 7B, a second stress-strain film 710 is then deposited. The second stress-strain film 710 is a material and/or thickness that provides a compressive stress. The second stress-strain film 710 is then patterned to remove the second stress-strain film 710 from the elongated strip over the first stress-strain film 708. The second stress-strain film 710 directs a compressive stress 711 along the short axis 704 of the MTJ 702.

A magnetic memory apparatus, according to one aspect of the disclosure includes means for fixing magnetization in a first layer, means for providing tunneling magnetoresistance (TMR) in a second layer, and means changing a direction of magnetization in a third layer. The apparatus also includes means for directing a stress to the third layer. The means for directing a stress is configured to reduce a switching current of the apparatus. According to an aspect of the disclosure, the directed stress includes an in-plane component and a perpendicular component. Referring to FIGS. 2A and 2B, the means for fixing magnetization may be the fixed layer 204, for example. The means for providing TMR may be the barrier layer 206, for example, and the means changing a direction of magnetization in a third layer may be the free layer 208, for example. The means for directing stress may be the stress-strain film 228, for example.

Although specific means have been set forth, it will be appreciated by those skilled in the art that not all of the disclosed means are required to practice the disclosed configurations. Moreover, certain well known means have not been described, to maintain focus on the disclosure.

Figure 8:
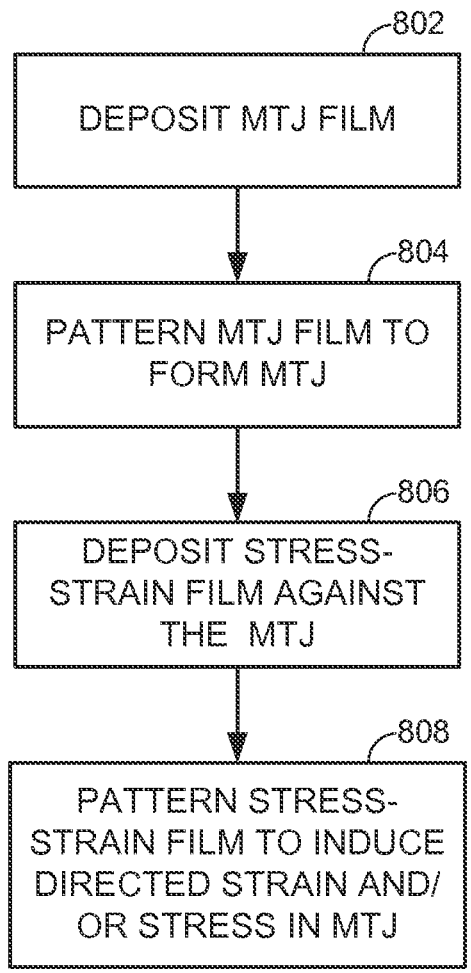
FIG. 8 is process flow diagram illustrating a method fabricating an MTJ device with reduced switching current according to aspects of the present disclosure.

FIG. 8 is a process flow diagram illustrating a method of fabricating a MTJ device with reduced switching current according to an aspect of the present disclosure. In block 802, the method includes depositing an MTJ film. In block 804, the method includes patterning the MTJ film to form an MTJ. In block 806, a stress-strain film is deposited against the MTJ. In block 808, the stress-strain film is patterned to induce a directed strain/stress in the MTJ. According to aspects of the disclosure, the directed strain/stress may include an in-plane component and a perpendicular component. More than one stress-strain film may be deposited to provide directed strain/stress in more than one in-plane direction.

Figure 9:
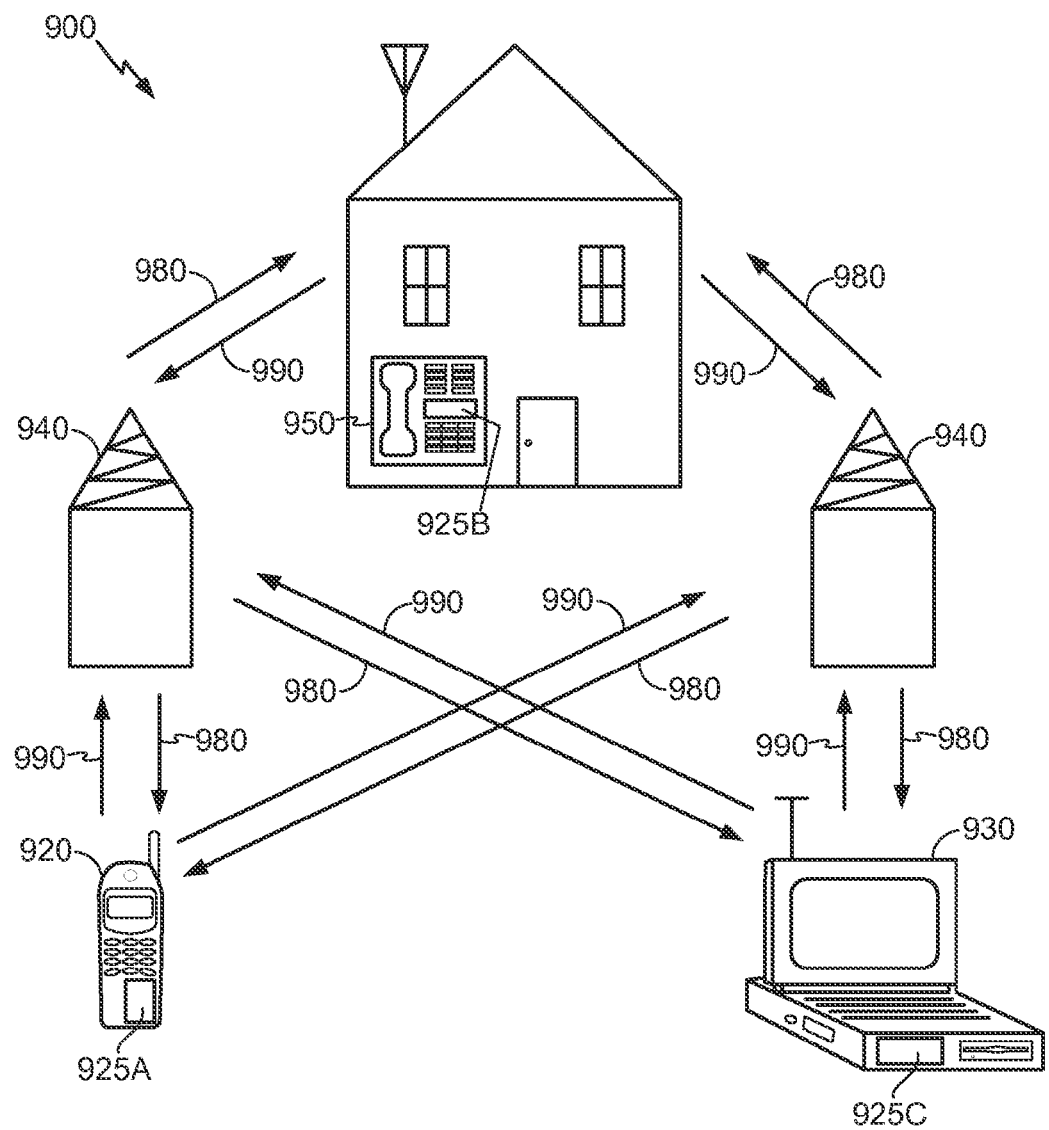
FIG. 9 is a block diagram showing an exemplary wireless communication system in which aspects of the disclosure may be advantageously employed.

FIG. 9 is a block diagram showing an exemplary wireless communication system 900 in which an embodiment of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925C and 925B that include the disclosed MRAM. It will be recognized that other devices may also include the disclosed MRAM, such as the base stations, switching devices, and network equipment. FIG. 9 shows forward link signals 980 from the base station 940 to the remote units 920, 930, and 950 and reverse link signals 990 from the remote units 920, 930, and 950 to base stations 940.

In FIG. 9, remote unit 920 is shown as a mobile telephone, remote unit 930 is shown as a portable computer, and remote unit 950 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 9 illustrates remote units according to the teachings of the disclosure, the disclosure is not limited to these exemplary illustrated units. Embodiments of the disclosure may be suitably employed in many devices which include MRAM.

Figure 10:
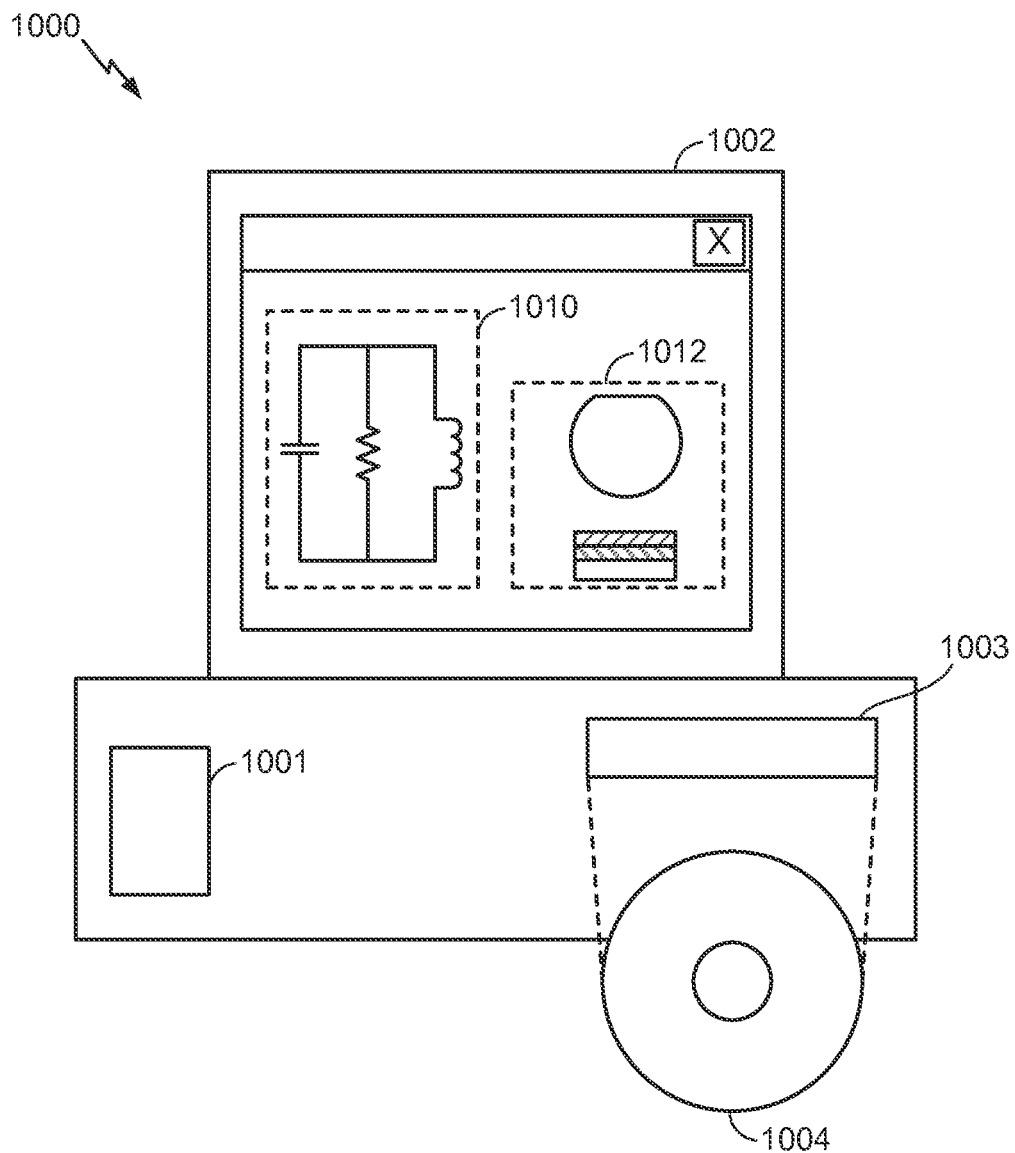
FIG. 10 is a block diagram illustrating a design workstation used for circuit, layout, and logic design of a semiconductor component according to one aspect of the present disclosure.

FIG. 10 is a block diagram illustrating a design workstation used for circuit, layout, and logic design of a semiconductor component, such as the MRAM disclosed above. A design workstation 1000 includes a hard disk 1001 containing operating system software, support files, and design software such as Cadence or OrCAD. The design workstation 1000 also includes a display 1002 to facilitate design of a circuit 1010 or a semiconductor component 1012 such as an MRAM. A storage medium 1004 is provided for tangibly storing the circuit design 1010 or the semiconductor component 1012. The circuit design 1010 or the semiconductor component 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit design 1010 or the semiconductor component 1012 by decreasing the number of processes for designing semiconductor wafers.

For a firmware and/or software implementation, the methodologies may be implemented with modules (e.g. procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer, disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that portions of the disclosed circuitry can be used to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of fabricating a magnetic tunnel junction (MTJ) device with reduced switching current, the method comprising:
   depositing an MTJ film;
   patterning the MTJ film to form an MTJ;
   depositing a stress-strain film against the MTJ;
   patterning the stress-strain film in a pattern that induces a directed static strain and/or stress in the MTJ;
   patterning an oxide spacer between the MTJ and the stress-strain film, the oxide spacer having an angled surface configured to apply a desired direction of the directed static strain and/or stress, and
   planarizing the stress-strain film and the oxide spacer to expose a free layer of the MTJ.

2. The method of claim 1, further comprising patterning the stress-strain film in a pattern that induces an in-plane component of the directed static stress and/or strain and a perpendicular component of the directed static stress and/or strain.

3. The method of claim 1, further comprising patterning the stress-strain film in a pattern that induces a substantially constant static stress and/or strain in the MTJ during operation of the MTJ device.

4. The method of claim 1, further comprising patterning the stress-strain film in a pattern that induces a first tensile stress perpendicular to a plane of the MTJ film.

5. The method of claim 4, further comprising patterning the stress-strain film in a pattern that induces a first compressive stress parallel to the plane of the MTJ film.

6. The method of claim 5, further comprising patterning the stress-strain film in a pattern that induces a second tensile stress parallel to the plane of the MTJ film and perpendicular to the first compressive stress.

7. The method of claim 6 in which patterning the MTJ film includes patterning a short axis of the MTJ parallel to the plane of the MTJ film, and patterning a long axis of the MTJ parallel to the plane of the MTJ film, and in which the first compressive stress is directed along the short axis and the second tensile stress is directed along the long axis.

8. The method of claim 1, further comprising depositing a cap film between the MTJ and the oxide spacer.

9. The method of claim 1, further comprising depositing a cap film between the MTJ and the stress-strain film.

10. The method of claim 1, further comprising integrating the MTJ device within a perpendicular magnetic random access memory (MRAM).

11. The method of claim 1, further comprising integrating the MTJ device within an in-plane magnetic random access memory (MRAM).

12. The method of claim 1, further comprising integrating the MTJ device into at least one of a mobile phone, a set top box, a music player, a video player, an entertainment unit, a navigation device, a computer, a hand-held personal communication systems (PCS) unit, a portable data unit, and a fixed location data unit.

13. A computer program product for fabricating a magnetic tunnel junction (MTJ) device with reduced switching current, comprising:
   a non-transitory computer readable medium having encoded thereon program code, the program code comprising:
   program code to deposit an MTJ film;
   program code to pattern the MTJ film to form an MTJ;
   program code to deposit a stress-strain film against the MTJ;
   program code to pattern the stress-strain film in a pattern that induces a directed static strain and/or stress in the MTJ; and
   program code to pattern an oxide spacer between the MTJ and the stress-strain film, the oxide spacer having an angled surface configured to apply a desired direction of the directed static strain and/or stress.

14. The computer program product of claim 13, further comprising program code to pattern the stress-strain film in a pattern that induces an in-plane component of the directed static stress and/or strain and a perpendicular component of the directed static stress and/or strain.

15. The computer program product of claim 13, further comprising program code to pattern the stress-strain film in a pattern that induces a substantially constant static stress and/or strain in the MTJ during operation of the MTJ device.

16. The computer program product of claim 13, further comprising program code to pattern the stress-strain film in a pattern that induces a first tensile stress perpendicular to a plane of the MTJ film.

17. The computer program product of claim 16, further comprising program code to pattern the stress-strain film in a pattern that induces a first compressive stress parallel to the plane of the MTJ film.

18. The computer program product of claim 13, further comprising program code to integrate the MTJ device into at least one of a mobile phone, a set top box, a music player, a video player, an entertainment unit, a navigation device, a computer, a hand-held personal communication systems (PCS) unit, a portable data unit, and a fixed location data unit.

19. A method of fabricating a magnetic tunnel junction (MTJ) device with reduced switching current, the method comprising:
   a step for depositing an MTJ film;
   a step for patterning the MTJ film to form an MTJ;
   a step for depositing a stress-strain film against the MTJ;
   a step for patterning the stress-strain film in a pattern that induce a directed static strain and/or stress in the MTJ; and
   a step for patterning an oxide spacer between the MTJ and the stress-strain film, the oxide spacer having an angled surface configured to apply a desired direction of the directed static strain and/or stress.

20. The method of claim 19, further comprising a step for integrating the MTJ device into at least one of a mobile phone, a set top box, a music player, a video player, an entertainment unit, a navigation device, a computer, a hand-held personal communication systems (PCS) unit, a portable data unit, and a fixed location data unit.

\* \* \* \* \*